United States Patent [19]

Bogenschütz et al.

[11] Patent Number: 4,832,988

[45] Date of Patent: May 23, 1989

[54] PROCESS FOR CHEMICALLY METALLIZING AN INORGANIC SUBSTRATE

[75] Inventors: August F. Bogenschütz, Oberdischingen; Josef L. Jostan; Robert Ostwald, both of Ulm, all of Fed. Rep. of Germany

[73] Assignee: Licentia Patent-Verwaltungs-GmbH, Frankfurt am Main, Fed. Rep. of Germany

[21] Appl. No.: 885,253

[22] Filed: Jul. 7, 1986

[30] Foreign Application Priority Data

Jul. 4, 1985 [DE] Fed. Rep. of Germany ....... 3523956

[51] Int. Cl.$^4$ .............................. B05D 3/04
[52] U.S. Cl. ..................... 427/305; 427/98; 427/309
[58] Field of Search ................... 427/98, 309, 305

[56] References Cited

U.S. PATENT DOCUMENTS

| | | | |
|---|---|---|---|
| 2,337,460 | 12/1943 | French | 427/309 |
| 3,802,907 | 4/1974 | Apfelbach et al. | |
| 4,574,094 | 3/1986 | De Luca | 427/98 |
| 4,604,299 | 8/1986 | DeLuca | 427/98 |
| 4,647,477 | 3/1987 | De Luca | 427/98 |

FOREIGN PATENT DOCUMENTS

| | | |
|---|---|---|
| 0035626 | 9/1981 | European Pat. Off. |
| 2533524 | 5/1978 | Fed. Rep. of Germany |
| 2453192 | 9/1978 | Fed. Rep. of Germany |
| 2947886 | 10/1980 | Fed. Rep. of Germany |
| 131998 | 7/1985 | Japan ............... 427/309 |
| 2112023 | 7/1983 | United Kingdom ..... 427/304 |

OTHER PUBLICATIONS

English Abstracts of German Patent Nos. DE 3523956, DE 2533524, DE 2453192, DE 2533523, DE 2947886.
IBM Technical Disclosure Bulletin, Band 14, No. 10, March 10th, 1972, p. 2856.

*Primary Examiner*—Shrive Beck
*Assistant Examiner*—Vi D. Dang
*Attorney, Agent, or Firm*—Spencer & Frank

[57] ABSTRACT

Process for chemically metallizing an inorganic substrate, which is a poor conductor of electricity, e.g. a ceramic material or glass. The surface of the substrate is chemically activated so that chemical bonds are more readily formed with a subsequently applied, inorganic adhesion promoter. The adhesion promoter in turn facilitates chemical bonding with a subseqently applied metal layer, e.g. a copper layer, which is applied by a wet chemical method. The activation step and the step of applying an adhesion promoter, in combination with at least one thermal treatment, results in an adhesive strength between the metal layer and the substrate surface which equals or exceeds the adhesion strength of the surface of the substrate material.

14 Claims, No Drawings

PROCESS FOR CHEMICALLY METALLIZING AN INORGANIC SUBSTRATE

BACKGROUND OF THE INVENTION

1. Field of the Invention

The present invention relates to a process for chemically metallizing an inorganic substrate which is poor conductor of electricity and, in particular, to a wet chemical process of the electroless and/or electrolytic type for providing a copper metal layer on an inorganic substrate composed of a ceramic material, glass, enamel or other oxidic, nitridic, carbidic, silicic, boridic material or of mixtures or mixed compounds of these inorganic materials.

2. Background of the Art

Oxide ceramic materials, such as aluminum oxide, beryllium oxide, ferrite, titanate, zirconate, as well as quartz, enamel and some glasses, are often used in the electrical and electronic arts. The foregoing exemplary materials are basic substrate materials used in the electrical and electronic arts for film-type circuits (thick film circuits, thin film circuits, special circuit boards, hybrid circuits, and the like), carrier elements for discrete components (capacitors, filters, oscillators, resonators, integrated circuits, and the like), components for transmitting tubes, microwave tubes, and transparent front plates for displays provided with electrical supply or actuation lines.

Other ceramic or glass materials are used as assembly elements, carrier elements or in the form of layers in the semiconductor art. Examples of materials for these applications are silicon nitride, silicon oxide nitride, as well as carbidic layers. Quartz glass and other glasses are used as light waveguides in the laser art and in the optical communications art. Beryllium oxide is appreciated for its favorable heat conducting capability in components subject to thermal stresses.

In order to be functional in these electrical or electronic applications, these materials or layers must be metallized for the production of conductive paths and conductive terminals. Metallization is generally accomplished with copper or a copper alloy, since copper meets the requirements particularly well with respect to electrical conductivity, ductility, and solderability. Further, copper and copper alloys can be deposited in an electroless, i.e., a currentless chemical manner and can be then electrolytically reinforced using the layer deposited chemically as an electrode.

However, the adhesion of the copper coating to the substrate material generally poses a difficult problem since the substrate is usually chemically inert, very smooth, and repels surface coatings. If, for electrical or optical reasons, for example, the surface of the substrate material cannot be roughened or can only be roughened slightly, mechanical anchoring of the metal layer to the substrate contributes little to adhesion. Under such circumstances, a very thin copper layer readily develops bubbles during its electroless precipitation from a chemical copper bath and easily chips and peels away from the substrate. At the same time, however, wet chemical deposition is a preferred metallization technique since this procedure is essentially independent of format and geometry of the workpiece. In contrast to screen printing, vapor deposition or sputtering techniques, wet chemical deposition, i.e., electroless and/or electrolytic precipitation, is capable of precipitating a metal layer onto various structural forms or geometries, such as throughbores and other edges, essentially without problems.

In order to solve the adhesion problem attendant to wet chemical metallization, various prior art processes are known which employ an adhesion-promoting, intermediate layer. For example, German Pat. No. 2,004,133, which corresponds to U.S. Pat. No. 3,802,907 to Roland Apfelbach et al, discloses a process which provides a silicic acid or silicate intermediate layer; German Pat. No. 2,533,524, a copper oxide intermediate layer; and German Pat. No. 2,453,192, an acid or alkali adhesion promoter which is matched to the acidity of the substrate material. The mechanism by which these adhesion promoters improve adhesion is thought to be the fact that they form chemical bonds with the substrate material on the one hand and the copper coating on the other hand. These bonds are believed to be developed by mechanisms including dehydration, solid-state diffusion and/or solid-state reactions, since cotemporaneous thermal treatment or subsequent thermal treatment favorably influences the kinetics of these mechanisms and, thus, adhesion of the resulting metallization.

In principle, the attainable adhesive strength, measured as vertical peel strength, is very high and may even exceed the tensile strength of ceramic substrate itself. However, these high adhesive strengths are generally not realized uniformly over the entire substrate surface, but only at certain surface loci, which loci are believed to be particularly active centers present on the surface of the substrate. The same non-uniformity in adhesive strength is noted for the edges and throughbores of the substrate. This non-uniform effect, with its inherent disadvantage of causing production rejects, occurs most frequently in connection with chemically inert substrate materials which undergo a high temperature process during manufacture, such as sintering, and receive a firing skin or otherwise have been "killed by heat" (rendered chemically inert) during the sintering process. In such materials, the usual surface cleaning, for example, with organic solvents, with diluted aqueous cleaning agents based on a surfactant, or with chromosulfuric acid, is not sufficient.

SUMMARY OF THE INVENTION

Based on this state of the art, it is an object of the present invention to provide an improved process for chemically metallizing an inorganic substrate, particularly an inorganic substrate having a very smooth surface, to produce a uniformly-adhering metallization characterized by good adhesion in an economical and reliable manner.

This and other objects are attained by providing a process for chemically metallizing an inorganic substrate wherein a substrate to be chemically metallized is provided, which substrate is composed of an inorganic material, is a poor conductor of electricity, and has a surface in a first state. The first state of the surface is characterized by a substantial resistance to forming chemical bonds between the surface and a metal provided thereon. The surface of the substrate is activated by chemical treatment thereof with an activating agent. The activating agent converts the surface from the first state to a second state, which second state is characterized by a substantially reduced resistance to forming chemical bonds between the surface and a metal provided thereon. The surface in the second state is thus an activated surface. An adhesion promoter is applied to the activated surface. The adhesion promoter is comprised of an inorganic material and facilitates chemical bond formation between the activated surface and a metal formation provided thereon. The substrate is thermally treated to promote chemical bond formation between the activated surface and a metal. The activated substrate is metallized by chemically precipitating a metal onto the activated surface of the substrate from a chemical bath.

A preferred chemical process for the metallizing step is the electroless/electrolytic process and includes the steps of providing a catalytic germination layer on the substrate, which layer is capable of catalyzing electroless precipitation of metal thereon; precipitating a first electrically conductive metal layer onto the catalytic germination layer by electroless precipitation from a chemical bath; and electrolytically precipitating a second electrolytically conductive metal layer onto the first layer from an electrolytic bath. The improvement to this chemical process according to the present invention is a pretreatment, prior to the step of providing the catalytic germination layer, as recited above.

The substrate useful in the present invention is an inorganic material. Preferably the inorganic material is selected from the group consisting of a ceramic, a glass, an enamel, an oxidic material, a nitridic material, a carbidic material, a silicic material, a boridic material, and mixtures thereof.

The inorganic substrate is preferably metallized with copper or a copper alloy.

When the surface in the first state is a non-oxidic surface, the activating agent converts the surface to a second state which is an oxidic surface. Further, when the surface in the first state reacts as a Lewis acid, the preferred activating agent is an alkali medium. The preferred alkali medium is selected from the group consisting of a hot saturated alkali base, an alkali hydroxide melt, an alkali carbonate melt, a hot alkali hydroxide solution under pressure, an alkali hydroxide solution including an additive therein, which additive is a complex-forming material, an alkali-reacting solution, an alkali-reacting melt, and mixtures thereof.

Similarly, when the surface in the first state reacts as a Lewis base the preferred activating agent is an acid medium. The preferred acid medium is selected from the group consisting of hot phosphoric acid, a mixture of phosphoric acid and sulfuric acid, a solution containing a fluoride, a melt containing a fluoride, a melt containing an alkali hydrogen, a melt containing an alkali disulfate, and mixtures thereof.

The preferred adhesion promoter is selected from the group consisting of copper oxide, silicic acid, a silicate and mixtures thereof. The most preferred adhesion promoter is copper (I) oxide.

A thermal treatment is advantageous during and/or after at least one of the process steps to promote chemical bond formation. The preferred thermal treatment is one conducted at a temperature ranging from 100° to 500° C. Thus, the surface activation step may include a thermal treatment, either before, after or during the chemical treatment with an activating agent. The step of applying the adhesion promoter may include a thermal treatment either before, after or during the application, in order to promote, for example, diffusion.

DESCRIPTION OF THE PREFERRED EMBODIMENTS

In contrast to prior art processes, the present invention is based on the realization that it is necessary to activate the surface of substrates of the above type in a positive manner. The surface of such substrate materials is initially characterized by a substantial inertness or resistance to the formation of chemical bonds. The surface must therefore be uniformly converted to a state of reduced resistance to the formation of chemical bonds for which, preferably, the surface must be treated so as to be able to enter into chemical bonding at a high density over its entire activated surface.

This desired surface activity alone, however, does not provide the desired uniform adhesion result. The surface activation step must be combined with the application of an adhesion promoter and with thermal treatment. Thus, an adhesion promoter is employed which is applied directly to the activated surface and/or is provided thereon simultaneous with the deposition of a metal layer. Further, a thermal treatment before, during and/or after at least one of the process steps has been found to be necessary in order to reinforce and/or accelerate the formation of chemical bonds, such as by mechanisms including diffusion and/or transportation.

The invention will be described in detail below with reference to embodiments thereof.

The adhesion promoter is matched in a known manner, for example, according to German Pat. No. 2,453,192, with the substrate material and the acidity of the activated substrate. The objective of facilitating chemical bond formation is in the foreground in the selection of an adhesion promoter. For example, if the substrate material is highly pure, polycrystalline $Al_2O_3$, a suitable adhesion promoter is $Cu_2O$ as disclosed in German Pat. No. 2,533,524. $Cu_2O$ forms strong chemical bonds in an oxide addition reaction. A chemically very resistant compound of the spinel type is formed at the interface between the $Al_2O_3$ and the $Cu_2O$ according to the following reaction.

$$Al_2O_3 + Cu_2O = Cu_2Al_2O_4$$

This reaction is discussed, for example in, Steiner, I.: "Bestimmung der Reaktionsenthalpie für die Oxidaddition $Cu_2O + Al_2O_3 = Cu_2Al_2O_4$ aus Haftfestigkeitsmessungen" [Determination of the Reaction Enthalpy for the Oxide Addition $Cu_2O + Al_2O_3 = Cu_2Al_2O_4$ from Adhesion Measurements], Ber. Dtsch. Keram. Ges. 58 (1981) No. 2, pages 90–92. Preferred thermal treatment temperatures for facilitating this oxide addition reaction kinetically lie in a range of from 300° C. to 400° C. However, the reaction equilibrium is reached very slowly according to the prior art processes, as a result of the reaction inertia of $Al_2O_3$. Even if temperatures as high as, for example, 900° C. are employed, the equilibrium is not reached for several days or weeks. However, it is desirable to react until an equilibrium state is achieved in order to realize a maximum adhesion over the entire surface.

To overcome the kinetic inhibition typical of prior art adhesion promotion techniques which cannot be overcome by heat alone, the process according to the present invention therefore provides a positive surface activation step which causes a chemically inert surface to be converted to a chemically reactive surface. Activation of substrate surfaces which react as a Lewis acid generally require chemical treatment with an alkali medium. Activation of substrate surfaces which react as a Lewis base generally require chemical treatment with an acid medium. Medium conditions and activation conditions, such as the concentration of the activating agent, temperature, pressure and agitation, are selected in such a way that only the surface layer (glass skin, firing skin, inactive zones) of the substrate is removed or chemically converted to form an active surface having "free valences". Chemically the activated surface is characterized by a substantially reduced resistance to forming chemical bonds. Thus, depending on the type of substrate material involved, nonpolar atom groupings are converted to polar groupings, or interfering foreign atoms are removed.

Physically, the surface activation produces a highly disturbed, high energy surface which has numerous grid disturbances, offsets, corners and edges in its (sub)microcrystalline structure. At the same time, surface roughening in the crystalline region, such as grain boundary etching, is substantially avoided. Grain boundary etching is generally to be avoided since such etching disadvantageously loosens the crystallite bonds of ceramics. On the other hand, surface swelling of the structure of, for example, glass-like substrates, increases chemical reaction capability.

The nonoxidic ceramics provide particularly demonstrative examples of the necessity to convert the substrate surface into a reactive surface. According to the invention, these nonoxidic surfaces are converted to hydroxide surfaces or oxide surfaces, for example, by hydrolysis reactions. These hydroxide surfaces or oxide surfaces are then able to continue to react with the adhesion promoter, e.g., $Cu_2O$, in oxide addition reactions, according to the reactions given by the following equations:

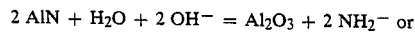

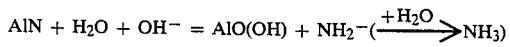

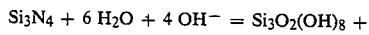

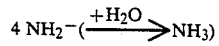

Inert $Al_2O_3$ ceramics are equipped with fresh and active crystal faces by cleaving the Al—O—Al bonds and converting them to polar end groups having the form of —O—Al—OH and —O——Al—O⁻, respectively. For the other substrate materials listed above analogous bonds are cleaved and converted to polar end groups.

Due to the poor chemical reactionability of the layer near the surface of these substrate materials, it is generally necessary to produce activation by severe means and/or conditions including using strong acids or bases, increased temperatures, great temperature differences and/or ultrasonic excitation. Examples of useful alkali activation media include hot saturated sodium or potassium bases, alkali hydroxide melts or alkali carbonate melts, as well as pressure decomposition with a 30% NaOH or KOH solution at 240° C. By adding complex formers (mannite, EDTA, and the like), the effectiveness of the alkali activation media can be increased. Examples of useful acid media include solutions or melts of fluorides (HF, $KHF_2$, $NH_4HF_2$, $HBF_4$), melt mixtures of boric acid and fluorides ($H_3BO_3 + NaF$), hot concentrated phosphoric acid, hydrogen or disulfate melts.

The process according to the invention will be explained in greater detail below by means of several examples, without these examples, however, being intended to in any way limit the invention.

EXAMPLE 1

A substrate composed of highly pure aluminum oxide, sintered ceramic material (>99.6% $Al_2O_3$) in the form of a small plate 0.6 to 0.7 mm thick and provided with a plurality of throughbores 0.5 to 1.0 mm in diameter was selected for coating on both sides with 10 microns of well-adhering copper. Such a substrate is used for the production of a thin film circuit. The surface roughness of the ceramic substrate was measured to be 0.1 micron. After prerinsing in deionized water, the substrate was heated in air at 350° to 400° C. in a tubular furnace so as to thermally activate it, followed by immersion for 0.1 to 30 seconds, preferably for 1 second, in a saturated sodium hydroxide solution at 120° C. so as to chemically activate it. The temperature difference produced mechanical stresses on the substrate surface which, if exposure to the lower temperature and the hydroxide solution is effected for only a short time, act only on the crystals at the surface, but are sufficient to break open inert crystal faces in the manner of stress crack corrosion. The treatment is particularly effective if the surface temperature, after the substrate has been pulled out of the base, increases again due to the heat capacity of the substrate and/or if the substrate is briefly heated again to 350° C. for 1 to 3 minutes in the tubular furnace. When the substrate has cooled to room temperature, the sodium hydroxide remainders were removed by rinsing in deionized water.

Thereafter, chemical copper precipitation took place with simultaneous deposition of the adhesion promoter $Cu_2O$. For the electroless precipitation, the substrate surface was provided with catalytic nuclei in the well-known manner with Sn/Pd and copper was precipitated from a commercially-available chemical bath without current to a layer thickness of 0.5 micron. In this copper layer, 5 to 10 weight %, preferably 8 weight %, $Cu_2O$ are embedded according to a process disclosed in German Pat. No. 2,533,524 (in the preferred embodiment of Example 5) or German Pat. No. 2,947,886 (in the preferred embodiment of Examples 1 or 3). To produce the actual adhesion promoting layer of $Cu_2O$ between the $Al_2O_3$ and the copper, the substrate was then heated to 400° C. for 10 minutes in a nitrogen atmosphere. After the subsequent electrolytic reinforcement of the copper layer to increase its thickness to a total thickness of 10 microns, the metallization layer exhibited an adhesive strength of 2500 to 3000 N/cm² as measured in the well-known vertical peel test. Adhesion was uniform over the entire substrate surface. Thus the adhesion of the metallization layer was measured to be greater than the tensile strength of the ceramic material itself.

EXAMPLE 2

A well-adhering copper plating onto an $Al_2O_3$ substrate was produced in the same manner as in Example 1, but with the difference that thermal and chemical activation occurred simultaneously. The substrate was immersed into a melt of sodium hydroxide having a temperature of 350° C. for a duration of 1 to 10 minutes, preferably 3 minutes.

EXAMPLE 3

Instead of the Al$_2$O$_3$ substrate, a substrate of boronitride was employed. To metallize this substrate in a well-adhering manner, the nitridic surface was converted to an oxidic or oxide nitridic surface so as to adapt, (i.e., to match) it to the adhesion promoter Cu$_2$O. Surface activation of the substrate was accomplished by immersion into a saturated sodium hydroxide solution at 120° C. to which from 1 to 10 g/l, preferably 3 g/l, of the complex former mannite had been added. The duration of this treatment depends on the respective inactivity of the substrate material, which may be subject to considerable fluctuations from one manufacturing batch to the next. An average duration of 5 minutes was found to be an approximate reference value for the time required to convert several atom layers of the nitride into oxide or oxide nitride, ammonia being also formed. If this activation treatment is insufficient for a particular batch of nitridic substrates, the mannite concentration may be increased or an alkali hydroxide melt may be used in place of the saturated alkali hydroxide solution. Otherwise the copper plating and the subsequent thermal treatment were performed as in Example 1.

EXAMPLE 4

A planar substrate made of so-called black ceramic material, e.g. a manganese-zinc ferrite, was surface activated by dipping it into concentrated phosphoric acid kept slightly below the boiling point, e.g., 85 weight % H$_3$PO$_4$ at 150° C. For most substrates of this type, about 10 minutes sufficed for the activation treatment. Cu$_2$O or amorphous silicic acid were used as the adhesion promoter. In accordance with German Pat. No. 2,004,133 (in the preferred embodiment of Example 3), amorphous silicic acid was applied to the substrate which, subsequently to the deposition of the copper plating layer of 0.5 micron, was heated for 15 minutes at 400° C. in a protective gas atmosphere. The resulting adhesion of the 10 micron thick copper was uniform over its entire surface and exceeded the resistance to breaking of the ceramic material.

EXAMPLE 5

A very smooth substrate of quartz glass was initially heated to about 500° C. and was then slowly immersed into a 30% KOH solution. By the simultaneous action of the steam which developed and hydroxide ions in the cooling phase, a surface activating "pyrohydrolysis" of the quartz glass took place. The Si-O lattice was hydrolyzed and swelled thereby providing a sufficiently active surface for the adhesion promoter. After cooling, the quartz glass was further treated according to Example 1.

The present disclosure relates to the subject matter disclosed in German Patent Application No. P 35 23 956.5 of July 4th, 1985, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. A process for chemically metallizing an inorganic substrate, comprising:
   a. providing a substrate to be chemically metallized, which substrate is composed of an inorganic material, is a poor conductor of electricity, and has a surface in a first state, which first state is characterized by substantial chemical inertness wherein the surface in the first state has a substantial resistance to forming chemical bonds between the surface and a metal provided thereon;
   b. activating the surface of the substrate by chemical treatment thereof with an activating agent which converts the surface from the first state to a second state under conditions of time and temperature effective to convert the surface without substantial roughening of the surface and without providing a further layer thereon, which second state is characterized by a substantially reduced resistance to forming chemical bonds between the surface and a metal provided thereon, the surface in the second state being an activated surface which is chemically reactive;
   c. applying an adhesion promoter to the activated surface, which adhesion promoter is comprised of an inorganic material and facilitates chemical bond formation between the activated surface and a metal provided thereon;
   d. thermally treating the substrate either before, during, and/or after at least one of steps b or c to promote chemical bond formation between the activated surface and a metal; and
   e. chemically metallizing the activated substrate by chemically precipitating at least one metal layer onto the activated surface of the substrate from a chemical bath whereby the adhesive strength between the at least one metal layer and the substrate equals or exceeds the tensile strength of the substrate.

2. The process according to claim 1, wherein the substrate is an inorganic material selected from the group consisting of a ceramic, a glass, an enamel, an oxidic material, a nitridic material, a carbidic material, a silicic material, a boridic material, and mixtures thereof.

3. The process according to claim 1, wherein the surface in the first state is a non-oxidic surface and wherein the activating agent converts the surface to a second state, which surface in the second state is an oxidic surface.

4. The process according to claim 1, wherein the surface in the first state reacts as a Lewis acid and wherein the activating agent is an alkali medium.

5. The process according to claim 4, wherein the alkali medium is selected from the group consisting of hot saturated alkali base, an alkali hydroxide melt, an alkali carbonate melt, a hot alkali hydroxide solution under pressure, an alkali hydroxide solution including an additive therein, which additive is a complex-forming material, an alkali-reacting solution, an alkali-reacting melt, and mixtures thereof.

6. The process according to claim 1, wherein the surface in the first state reacts as a Lewis base and wherein the activating agent is an acid medium.

7. The process according to claim 6, wherein the acid medium is selected from the group consisting of hot phosphoric acid, a mixture of phosphoric acid and sulfuric acid, a solution containing a fluoride, a melt containing a fluoride, a melt containing an alkali hydrogen, a melt containing an alkali disulfate, and mixtures thereof.

8. The process according to claim 1, wherein the adhesion promoter is selected from the group consisting of copper oxide, silicic acid, a silicate and mixtures thereof.

9. The process according to claim 1, wherein the adhesion promoter is copper (I) oxide.

10. The process according to claim 1, wherein thermal treatment is conducted at a temperature ranging from 100° to 500° C.

11. The process according to claim 1, wherein the surface activation step includes a thermal treatment.

12. The process according to claim 1, wherein the step of applying the adhesion promoter includes a thermal treatment.

13. The process according to claim 1, wherein the inorganic substrate is metallized with copper or a copper alloy.

14. In a chemical process for metallizing an inorganic substrate to provide at least one metal layer thereon including the steps of providing a catalytic germination layer on the substrate, which layer is capable of catalyzing electroless precipitation of metal thereon; precipitating a first electrically conductive metal layer onto the catalytic germination layer by electroless precipitation from a chemical bath; and electrolytically precipitating a second electrolytically conductive metal layer onto the first layer from an electrolytic bath, the improvement comprising a pretreatment, prior to the step of providing the catalytic germination layer, whereby the adhesive strength between the at least one metal layer and the substrate equals or exceeds the tensile strength of the substrate including:

a. providing a substrate to be chemically metallized, which substrate is composed of an inorganic material, is a poor conductor of electricity, and has a surface in a first state, which first state is characterized by substantial chemical inertness wherein the surface in the first state has a substantial resistance to forming chemical bonds between the surface and a metal provided thereon;

b. activating the surface of the substrate by chemical treatment thereto with an activating agent which activating agent converts the surface from the first state to a second state under conditions of time and temperature effective to convert the surface without substantial roughening of the surface and without providing a further layer thereon, which second state is characterized by a substantially reduced resistance to forming chemical bonds between the surface and a metal provided thereon, the surface in the second state being an activated surface which is chemically reactive;

c. applying an adhesion promoter to the activated surface, which adhesion promoter is comprised of an inorganic material and facilitates chemical bond formation between the activated surface and a metal provided thereon; and d. thermally treating the substrate either before, during, and/or after at least one of steps b or c to promote chemical bond formation between the activated surface and a metal.

* * * * *